United States Patent
Mack et al.

(10) Patent No.: US 6,968,253 B2
(45) Date of Patent: Nov. 22, 2005

(54) COMPUTER-IMPLEMENTED METHOD AND CARRIER MEDIUM CONFIGURED TO GENERATE A SET OF PROCESS PARAMETERS FOR A LITHOGRAPHY PROCESS

(75) Inventors: Chris Mack, Austin, TX (US); Robert Jones, Austin, TX (US); Jeffrey Byers, Lexington, TX (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 24 days.

(21) Appl. No.: 10/431,133

(22) Filed: May 7, 2003

(65) Prior Publication Data

US 2004/0225401 A1 Nov. 11, 2004

(51) Int. Cl.$^7$ .............................................. G06F 19/00
(52) U.S. Cl. ........................ 700/121; 700/28; 700/51
(58) Field of Search ......................... 700/121, 28, 51, 700/53–55; 438/5, 14–18; 716/2, 4, 21; 430/30

(56) References Cited

U.S. PATENT DOCUMENTS

| | | | | |
|---|---|---|---|---|
| 5,740,065 A | * | 4/1998 | Jang et al. ....................... 716/1 |
| 5,952,132 A | * | 9/1999 | King et al. .................... 430/22 |
| 6,535,774 B1 | | 3/2003 | Bode et al. | |
| 6,673,638 B1 | * | 1/2004 | Bendik et al. ................. 438/14 |
| 6,689,519 B2 | * | 2/2004 | Brown et al. .................. 430/30 |
| 6,716,559 B2 | * | 4/2004 | Leidy et al. ................... 430/22 |
| 6,716,646 B1 | * | 4/2004 | Wright et al. ................. 438/14 |
| 2002/0191165 A1 | * | 12/2002 | Baselmans et al. ........... 355/52 |

FOREIGN PATENT DOCUMENTS

| | | |
|---|---|---|
| WO | 01/84382 | 11/2001 |
| WO | 02/25708 | 3/2002 |
| WO | 02/084213 | 10/2002 |

OTHER PUBLICATIONS

Howard et al., "Tuning and simulating a 193 nm resist for 2D applications," Mar. 2002, 9 pages.
International Search Report, PCT/US2004/014212, mailed May 4, 2005.

* cited by examiner

Primary Examiner—Leo Picard
Assistant Examiner—Sean Shechtman
(74) Attorney, Agent, or Firm—Ann Marie Mewherter; Daffer McDaniel, LLP (57) ABSTRACT

A computer-implemented method and a carrier medium adapted to generate a set of process parameter values for a lithography process based upon both critical dimension and overlay effect analyses of process parameter value variations is provided. In some cases, the computer-implemented method and a carrier medium may be configured to select a set of process parameter values to collectively minimize the number critical dimension and overlay variation errors produced within an image fabricated from the lithography process.

8 Claims, 3 Drawing Sheets

COMPUTER-IMPLEMENTED METHOD AND CARRIER MEDIUM CONFIGURED TO GENERATE A SET OF PROCESS PARAMETERS FOR A LITHOGRAPHY PROCESS

BACKGROUND OF THE INVENTION

1. Field of the Invention

This invention generally relates to computer-implemented methods and carrier mediums used to enhance lithographic processes, and more particularly, to computer-implemented methods and carrier mediums used generate a set of process parameter values for a lithography process and/or a list of potential causes of specification deviations resulting from a lithographic process.

2. Description of the Related Art

The following descriptions and examples are not admitted to be prior art by virtue of their inclusion within this section.

Lithography processes may be used in a variety of applications. For instance, semiconductor device fabrication processes typically involve a number of lithography steps to form various features and multiple levels of a semiconductor device. In general, "lithography" may refer to a process in which a pattern is transferred onto a surface. As such, a lithography process used in the fabrication of a semiconductor device may refer to a process in which a pattern is transferred onto a wafer. In the fabrication of semiconductor devices, a lithography process may be conducted in multiple steps. For example, a lithography process may involve coating a wafer with a photoresist layer and subsequently transferring a patterned image from a reticle or mask to the photoresist material. In some cases, the process may include baking the wafer before and/or after the pattern transfer step such that residual solvent from the coating process may be removed and regions of the photoresist exposed and not exposed by the patterning process may be diffused, respectively. In any case, the process may include removing portions of the photoresist layer such that a pattern imaged from the reticle remains. Subsequently, the process may include etching underlying layers of the wafer to replicate the pattern formed within the resist material.

The accuracy and precision with which to fabricate a pattern on a wafer using such a process may be influenced by a variety of parameters. In particular, a lithography process may be affected by parameters of the lithographic tool, such as but not limited to, lens aberration, stage tilt, reticle tilt, exposure dose, and focus. In addition, the lithographic process may be affected by parameters other than those affiliated with the lithographic tool. For example, the chemistry used to etch the topography of the wafer as well as the planarity or thickness of the wafer topography to be patterned may contribute to the qualitative characteristics of the lithographic process. In addition or alternatively, the process parameters associated with the coating and/or bake processes, such as temperature, time, and deposition technique, may contribute to the qualitative nature of the lithography process.

Due to the plurality of process parameters involved within a lithographic process, wafer features may sometimes be fabricated with characteristics outside the specifications of the device. In some cases, the cause of the specification deviation may be determined by examining the history of the lithographic process parameter values and their affect on the outcome of wafer feature characteristics. In particular, reviewing historical data may be used to identify causes of process failure or drift. Such a method, however, may be time consuming, sacrificing the production throughput of the fabrication process. Furthermore, in some cases, the cause of specification deviations may be difficult to determine by simply reviewing historical data, since process parameter value tolerances and dependencies often change with advances in integrated circuit technology as explained in more detail below. As such, in some embodiments, causes of specification deviations may be determined by processing experimental wafers in which one or more process parameter values has been changed. Such a method, however, may also be time consuming as well as costly due to the use of sacrificial test wafers and materials.

In general, a lithography process has two objectives; forming features having dimensions within the design specifications of the device and aligning features within design specifications of the device. Such resolution and alignment goals may be monitored by measuring characteristics of a patterned wafer feature. More specifically, the resolution and alignment of a lithography process may be evaluated by measuring the critical dimensions and overlay variations of a patterned wafer feature, respectively. "Critical dimension" (CD), as used herein, may refer to a dimension of a wafer feature which is deemed to affect the functionality of a device formed therefrom. "Overlay variation," on the other hand, may refer to the amount a wafer feature is arranged away from its intended position on the wafer.

As stated above, several process parameters may affect a lithographic process. In some cases, certain parameters may primarily affect the critical dimension of a patterned wafer feature while other parameters may primarily affect the overlay variation of the patterned wafer feature. Such an embodiment may be particularly true for the fabrication of integrated circuits having a minimum critical dimension greater than approximately 0.25 microns. In any case, conventional techniques for determining process parameter values and/or correcting wafer feature specification deviations for a lithographic process typically include two distinct and separate analyses; one analyzing the affect of process parameter values on critical dimension and the other-analyzing the affect of process parameter values on overlay variation. In other words, no correlation is made between process parameter values affecting both the critical dimensions and overlay variations of a fabricated wafer.

As dimensions of wafer features continue to decrease with the advancement of integrated circuit technology, however, process parameter values of lithographic processes may affect both critical dimensions as well as overlay variations of the wafer features. For example, in some cases, a change in a process parameter value may benefit one measurement characteristic while adversely affecting the other measurement characteristic. For instance, as the tolerance for critical dimension error decreases, variation in process parameter values which only previously affected overlay variation, may also affect critical dimension and vice versa. In yet other embodiments, critical dimension errors and overlay variation errors may collectively contribute to the degradation of an integrated circuit. In particular, even though the critical dimension and overlay variation measurements may be acceptable when analyzed independently, their values may collectively produce a circuit which does not meet the specifications of the circuit design. Consequently, the conventional technique of separately analyzing the affect of process parameter values with respect to critical dimension and overlay variation may not generate an accumulative set of process parameters which produces a wafer feature within the design specifications of the device.

As such, it would be advantageous to develop a method and carrier medium which could collectively analyze critical dimension and overlay variation effects of process parameter changes. More specifically, it would be beneficial to develop a method and carrier medium which would generate a single set of process parameter values-which could correct overlay variation error as well as critical dimension error. In addition or alternatively, it would be advantageous to develop a method and carrier medium which would be able to generate a list of potential causes of specification deviations within a wafer fabricated, from a lithographic process in a timely and cost efficient manner.

SUMMARY OF THE INVENTION

The problems outlined above may be in large part addressed by a computer-implemented method and a carrier medium adapted to improve lithographic processes. In particular, a computer-implemented method and a carrier medium which are adapted to generate a set of process parameter values for a lithography process based upon both critical dimension and overlay effect analyses of process parameter value variations is provided. In a preferred embodiment, the computer-implemented method and carrier medium may be adapted to select a set of process parameter values which collectively minimize the number critical dimension and overlay variation errors produced within an image fabricated from the lithography process. In some cases, the set of process parameter values may be selected such that a wafer feature having characteristics within the design specifications of the device is formed. More specifically, in some embodiments, the set of process parameter values may be selected such that a wafer feature is formed having one or more characteristics substantially similar to the target specification values of the device. In any case, the method and carrier medium may be additionally or alternatively adapted to determine a correlation between process parameter values which affect both critical dimension and overlay of images produced from the lithography process.

As noted above, the computer-implemented method and carrier medium may be adapted to generate a set of process parameter values for a lithography process based upon both critical dimension and overlay effect analyses of process parameter value variations. In some cases, the generation of process parameter values may be based upon analyses of process parameter value variations which affect both critical dimension and overlay variation. In such an embodiment, the generation of process parameter values may also be based upon analyses of process parameter value variations which primarily affect the critical dimension of a patterned wafer feature. In addition or alternatively, the generation of process parameter values may be based upon analyses of process parameter value variations which primarily affect overlay variation of a patterned wafer feature. In yet other embodiments, however, the generation of process parameters may be based solely upon analyses of a first set of process parameter value variations which primarily affect critical dimension and a second set of process parameter value variations which primarily affect overlay. In such an embodiment, the method and carrier medium may be adapted to merge the analyses of the first and second set of process parameter value variations to obtain a set of process parameter values for the lithography process.

In some cases, the computer-implemented method and carrier medium described herein may additionally or alternatively be used for identifying potential causes of lithography process failure or drift. In particular, the computer-implemented method and carrier medium may be adapted for simulating the formation of wafer features having one or more characteristics which deviate from specification by changing one or more process parameter values within a lithographic process simulation module. For example, the method and carrier medium may be adapted for simulating the formation of wafer features having critical dimensions, overlay variations, and/or metrics describing the shape of the features which are out of specification for the device. In some cases, the method and carrier medium may be adapted for tuning the lithographic process simulation module with process parameter values used to fabricate wafers.

In any case, the computer-implemented method and carrier medium may be further adapted to match at least one of the simulated wafer feature characteristics with a deviant wafer feature characteristic fabricated from an actual lithography process. Such a method and carrier medium may continue with identifying one or more common process parameter values used to generate the simulated wafer feature and the fabricated wafer feature and then citing the one or more common process parameter values as potential causes of specification deviations within wafers fabricated from the lithography process. More specifically, the one or more common process parameter values may be cited as potential causes of the deviant characteristic of the simulated and fabricated wafer features. In some cases, the method and carrier medium may be adapted to repeat the steps of simulating, matching, identifying, and citing to produce a list of potential causes of specification deviations within wafers fabricated from the lithography process.

There may be several advantages to using the computer-implemented method and/or carrier medium described herein. For example, a list of potential causes of specification deviations within a wafer fabricated from a lithography process may be determined in a timely and cost efficient manner. In particular, a list of potential causes of lithography process failure or drift may be determined by back simulation techniques such that manual reviews of historical data and/or experimental wafer runs are reduced or discontinued. Consequently, less time may be spent altering a lithography process such that wafer features with characteristics within specification may be formed. As a result, production throughput may be increased. In addition, the computer-implemented method and carrier medium provided herein offers a manner with which to analyze process parameter variations affecting both critical dimension and overlay variation dependencies collectively. In this manner, the computer-implemented method and carrier medium may be used to generate a set of process parameter values which collectively minimize critical dimension and overlay variation specification deviations.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
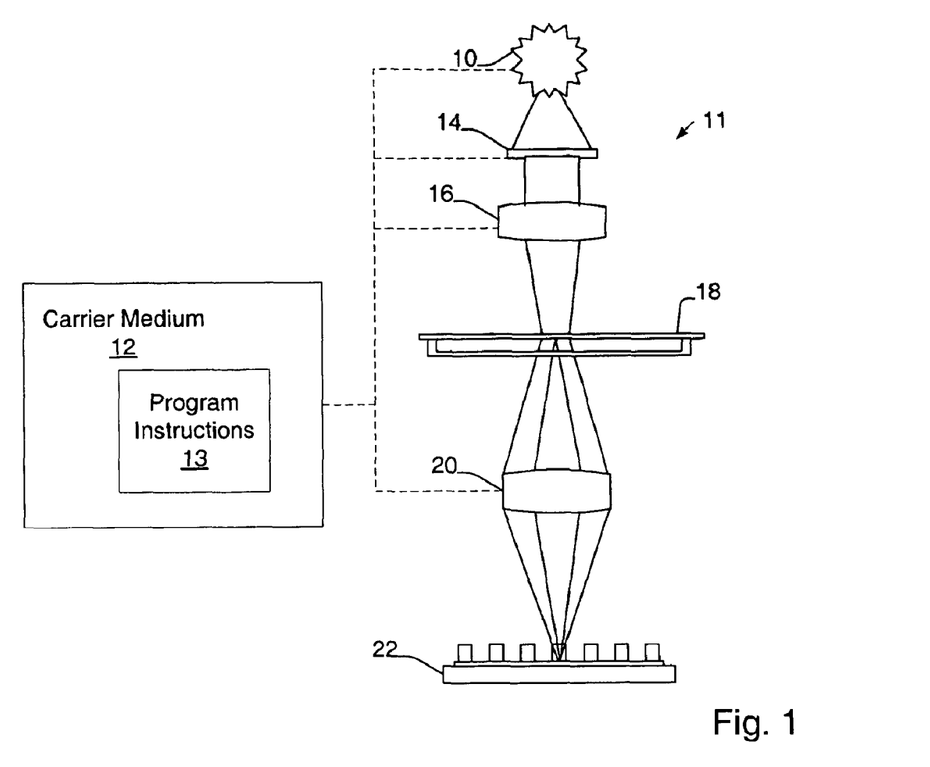
FIG. 1 depicts a schematic diagram of a side view of a lithography system.

Turning now to the drawings, exemplary embodiments of a method and a carrier medium which are adapted to enhance a lithography process are illustrated in FIGS. 1–4. More specifically, FIGS. 1–4 illustrate exemplary embodiments of a computer-implemented method and carrier medium which may be configured to generate a set of process parameters and/or a list of potential causes of deviations for a lithography process. For example, FIG. 1 illustrates a side view of lithography system 11 including carrier medium 12 coupled thereto. In some cases, carrier medium 12 may be a transmission medium such as a wire, cable, or wireless transmission link, or a signal traveling along such a wire, cable, or link. In yet other embodiments, carrier medium 12 may be a storage medium such as a read-only memory, a random access memory, a magnetic or optical disk, or a magnetic tape.

In either case, carrier medium 12 may include program instructions 13 as shown in FIG. 1. More specifically, program instructions 13 may be transmitted over or stored on carrier medium 12. In some cases, one or more data structures and/or rules databases may also be transmitted over or stored upon carrier medium 12. In general, program instructions 13 may be configured to implement the methods described below in reference to FIGS. 2–4. In some embodiments, program instructions 13 may be additionally configured to implement other methods as well. For example, program instructions 13 may be configured to implement a method for tracking the process parameter values of lithography system 11 during operation. It is noted that although carrier medium 12 is shown coupled to lithography system 11 in FIG. 1, carrier medium 12 may alternatively be coupled to a cluster tool comprising lithography system 11 or may be contained within its own system. As such, the configuration of the carrier medium described herein is not restricted to the depiction of carrier medium 12 coupled to lithography system 11 in FIG. 1.

In addition, the configuration of lithography system 11 is not restricted to the illustration or description discussed in reference to FIG. 1. More specifically, lithography system 11 is shown and described as an exemplary system and, therefore, may include configurations and/or adaptations other than those shown and described reference to FIG. 1. For instance, tho components of lithography system 11 may include different or additional adaptations than those described below. In addition or alternatively, lithography system 11 may include more components than shown and described in reference to FIG. 1. For example, lithography system 11 may, in some embodiments, inside a homogenizer, a fly's eye Ions, a reticle blind, additional lenses, and/or reflective components. Other components or adaptations readily known for enhancing the replication of an image from a reticle to a wafer may also or alternatively be included within lithography system 11, depending on the design specifications of the system. As such, "lithography system", in some embodiments, may generally refer to a system that prints images of a reticle onto a specimen using light, including scanning projection systems and step-and-repeat systems (a.k.a. "steppers"). Such systems may be commercially available from Ultratech, Inc. of San Jose, Calif.; Nikon Corporation of Tokyo, Japan; ASML Company of the Netherlands; or Canon, Inc. of Tokyo, Japan for example. In other embodiments, "lithography system" may refer to a direct write lithography system, such as laser scanner systems, which may be used to write patterns without the use of a reticle.

As shown in FIG. 1, lithography system 11 may include light source 10. Light source 10 may include, for example, a mercury lamp or an excimer laser. Other light sources known for use in lithography systems, however, may also be used. In a preferred embodiment, light source 10 may be configured to emit light having a selected wavelength. For example, light source 10 may be configured to emit light with wavelengths of 365 nm, 248 nm, 193 nm, or 157 nm. In other embodiments, light source may be configured to emit smaller or larger wavelengths, depending on the design specifications of lithography system 10. In some cases, light source 10 may be configured to emit nearly monochromatic light of the selected wavelength. Alternatively, light source 10 may include a broadband light source coupled to a spectral filter, which is configured to transmit the selected wavelength range.

In any case, light from light source 10 may be projected through aperture 14 to guide the light toward condenser lens 16 as shown in FIG. 1. In general, condenser lens 16 may be adapted to concentrate the light emitted from aperture 14. In this manner, the projection of light exiting condenser lens 16 may be concentrated to illuminate reticle 18. Reticle 18 may have a pattern with which to replicate on to a surface. In some embodiments, the pattern may include an design layout of a particular planar region of an integrated circuit. In any case, a portion of the light emitted from condenser lens 16 is shielded by opaque regions of reticle 18, while other portions of light are transmitted through transparent regions of reticle 18. In this manner, the light passing through reticle 18 may emulate the pattern image of the reticle.

As shown in FIG. 1, light transmitted by reticle 18 may be collected by projection lens 20 and then illuminated on wafer 22. In general, projection lens 20 may be adapted to reduce the size of the pattern image included within reticle 18 such that lithography system 11 may achieve a relatively high resolution. "Resolution," as used herein, may refer to the objective of the lithography system to form wafer features with dimensions substantially similar to the design specifications of the device. In general, wafer 22 may include one or more layers formed on a semiconductor substrate. The one or more layers may include a resist and, in some embodiments, another layer such as a top or bottom anti-reflective coating layer. In some cases, wafer 22 may include additional layers and/or structures interposed between the semiconductor substrate and the resist layer. Such layers and structures may include, but are not limited to, dielectric layers, conductive layers, gate structures, interconnect lines, and isolation structures. In this manner, the computer-implemented method and carrier medium described herein may be used for patterning layers within any planar region of a semiconductor topography.

Figure 2:
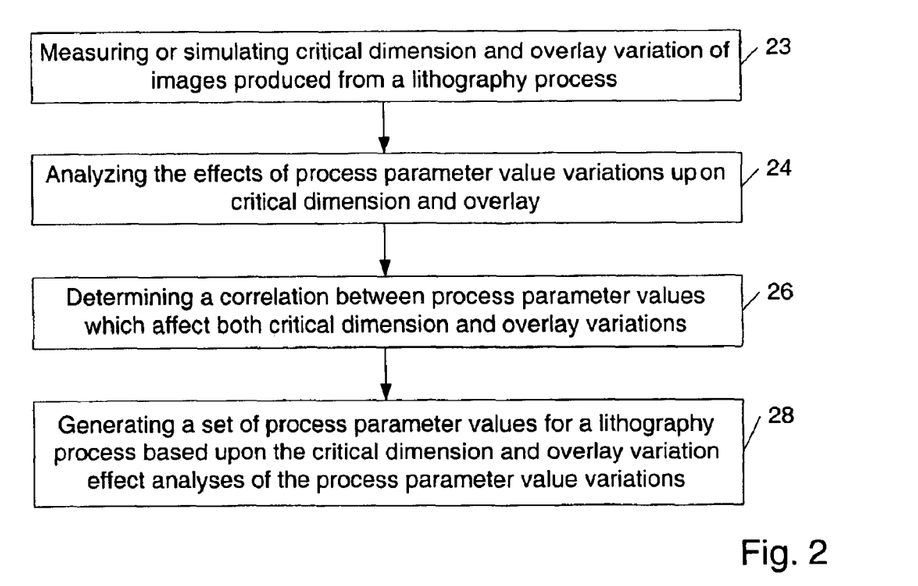
FIG. 2 depicts a flow chart for generating a set of process parameters for a lithography process.
Figure 3:
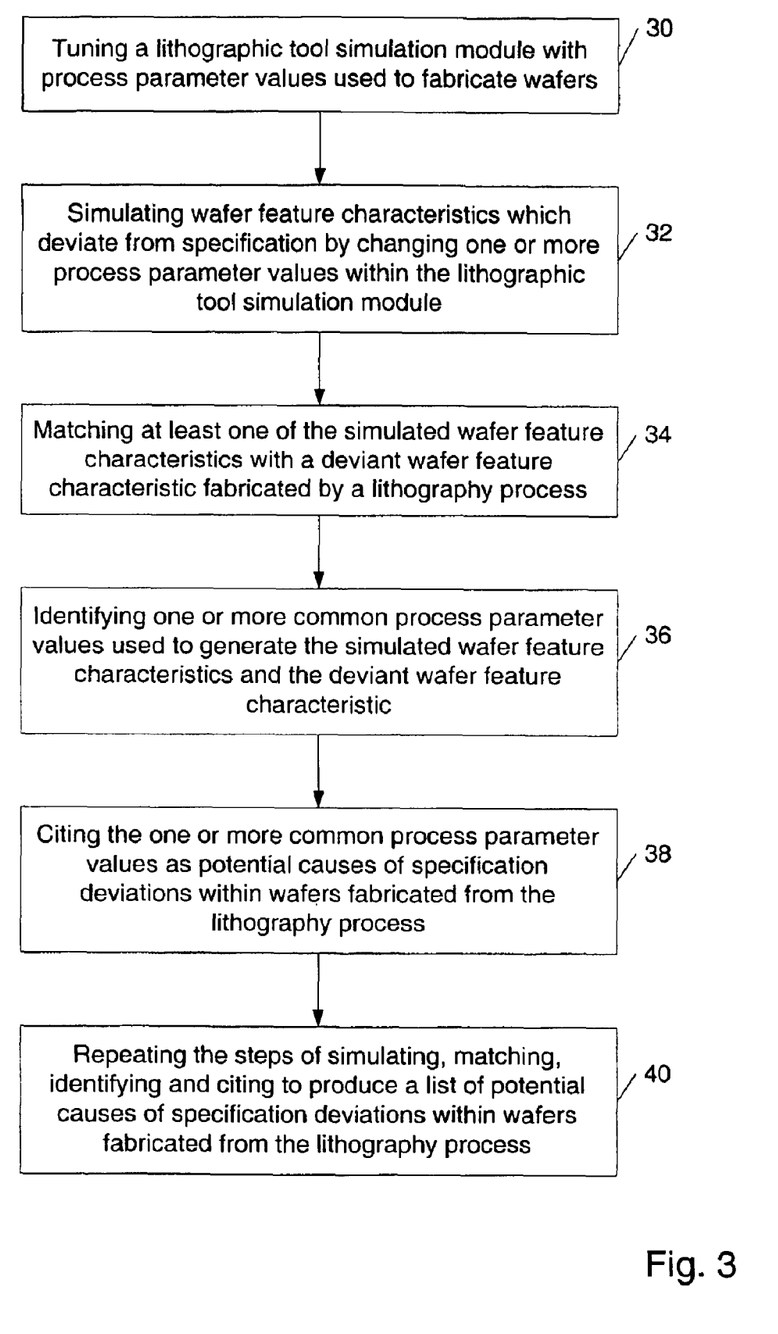
FIG. 3 depicts a flow chart for generating a set of potential causes of specification deviations formed from a lithography process.
Figure 4:
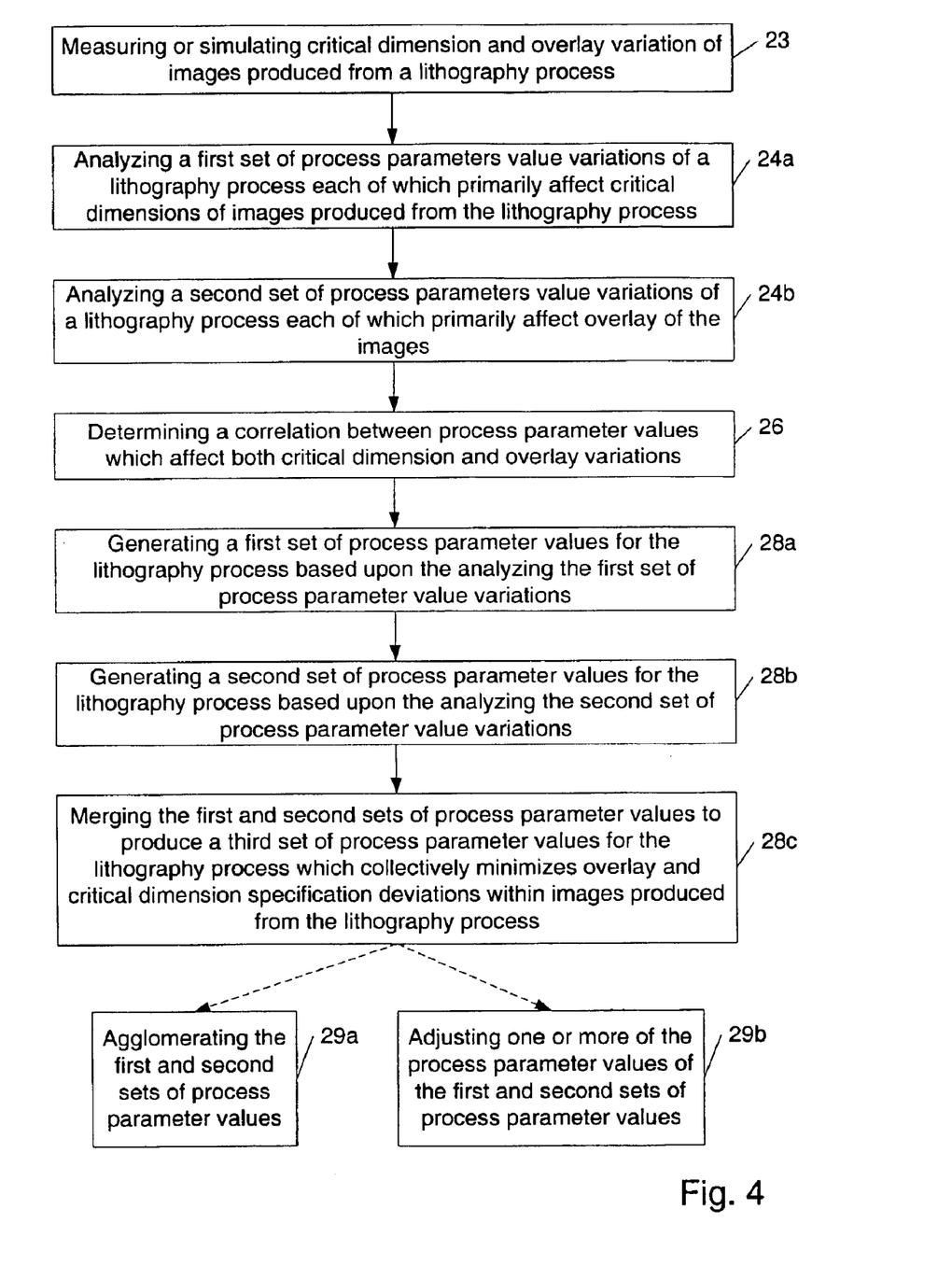
FIG. 4 depicts a flow chart of exemplary steps for method depicted in FIG. 2.

FIGS. 2–4 illustrate flowcharts of computer-implemented methods which are configured to enhance the operation of a lithography process. In particular, FIG. 2 illustrates a computer-implemented method for generating a set of process parameters for a lithography process based upon both critical dimension and overlay variation effect analyses of process parameter value variations. In other words, FIG. 2 illustrates a method which collectively analyzes the affect of process parameter variations for both critical dimension and overlay variations of patterned wafer features such that a single set of process parameters may be determined for a lithography process. FIG. 4 illustrates a specific embodiment of the method depicted in FIG. 2, FIG. 3, on the other hand, illustrates a computer-implemented method for generating a list of potential causes of specification deviations within wafer features formed from a lithography process. As noted above, carrier medium 12 may include program instructions for implementing the method of FIGS. 2–4. As such, a carrier medium is provided which includes program instructions for conducting one or more of the steps listed in FIGS. 2–4.

"Lithography process," as used herein, may refer to a process of replicating a pattern image to a wafer. As noted above, such a process includes process parameters which are directly associated with the lithographic tool as well as process parameters which are independent of the lithographic tool. More specifically, process parameters of a lithography process may include, but are not limited to, lens aberration, stage tilt, reticle tilt, exposure dose, and depth of focus as well as etch chemistry composition and resist thickness. As such, the term "lithography process," as used herein, may be distinct from the characterization of a "lithographic system." More specifically, "lithography system" may refer the tool used to supply and transmit light to a surface to be patterned, while "lithography process" may refer to the process of patterning the surface to form features which have a substantially similar pattern as the intended circuit design. In general, the method described herein is preferably carried out through the use of a software module. More specifically, the method described herein may include analyzing and computing a relatively large amount of data through the use of one or more algorithms and, therefore, may be best implemented through a computer. Consequently, the method described herein may sometimes be referred to as a "computer-implemented method." In other cases, however, the method may be more generally referred to the "method." It is noted that the use for the two terms is not mutually exclusive and, therefore, may be used interchangeably.

As shown in FIG. 2, the computer-implemented method for generating a set of process parameters for a lithography process may include step 23 in which critical dimension and overlay variation are measured and/or simulated for an image produced from a lithography system. In embodiments in which the lithographic metrics are measured, the step may involve any metrology technique known in the semiconductor fabrication industry. In embodiments in which the lithographic metrics are simulated, however, step 23 may be conducted by a simulation software program, such as PROLITH which is commercially available from KLA-Tencor Corporation of San Jose, Calif. In general, PROLITH can simulate optical lithography and etch processes to provide images and three-dimensional representations of a wafer using a specific process parameter values. More specifically, the software provides data-fitting and analysis capabilities of lithography processes that are substantially physically correct.

In either case, the method may further include step 24 in which critical dimension and overlay variation effects of process parameter value variations are analyzed. In some cases, step 24 may include an analysis of a first group of process parameter value variations which primarily affect critical dimension as noted in block 24a of FIG. 4 and an analysis of a second group of process parameter value variations which primarily affect overlay as noted in block 24b of FIG. 4. In such an embodiment, the method may include merging the analyses of the first and second groups of process parameter value variations to obtain a set of process parameter values for the lithography process as noted in block 28c of FIG. 4. In particular, the method may include merging sets of process parameter values determined from the analysis of the first and second groups of process parameter value variations as noted in blocks 28a and 28b in FIG. 4 to obtain a third set of process parameter values for the lithography process. Such a merging step may, in some embodiments, include agglomerating the process parameter values determined from the analyses of the first and second groups of process parameter value variations as noted in block 29a in FIG. 4 extending as a dotted line from block 28c. In this manner, the final set of process parameter values may be the same as the process parameter values determined from the individual analyses of the first and second groups of process parameter value variations. In other embodiments, however, the merging step may include generating a set of process parameter values which are different from the process parameter values determined from the analyses of the first and second groups of process parameter value variations. In particular, the merging step may include adjusting the process parameter values generated from the analyses of the first and second group of process parameter value variations as noted in block 29a in FIG. 4 extending as a dotted line from block 28c since some process parameter values may affect both critical dimension and overlay variation as discussed in more detail below.

In some cases, step 24 may alternatively include analyzing the effects of critical dimension and overlay variation at the same time. In particular, the analyses process parameter value variations with regard to critical dimension and overlay variation of a wafer feature may not be conducted independent of each other as described in the embodiment above. Rather, the effects of critical dimension and overlay variation may be analyzed simultaneously to generate a set of process parameter values which reflect the affect of process parameter value variations on both critical dimension and overlay variation. In this manner, the collective affect of lithographic metric errors upon the degradation of a resulting circuit can be accurately accounted for. For example, a combination of critical dimension and overlay variation errors may collectively cause the performance of a circuit to be degraded although the errors independently may fall within the specification of the device. In some cases, the computer-implemented method, in such an embodiment, may further include analyzing process parameter values which primarily affect the critical dimension of a patterned wafer feature. In addition or alternatively, the method may include analyzing process parameter value variations which primarily affect overlay variation of a patterned wafer feature. As such, the method, in such an embodiment, is not restricted to the analysis of process parameter values which only affect both critical dimension and overlay variation.

In any case, step 24 may be conducted through the use of algorithms relating the effects of process parameter value variations to critical dimension and overlay variations of wafer features. Such algorithms may be created from historical, experimental, or simulated data. For example, the characteristics of a patterned wafer may be analyzed using algorithms that are included in process window analysis software. One example of commercially available process window analysis software is the Klarity™ ProDATA advanced process window analysis software system available from KLA-Tencor, which automatically analyzes experimental lithography data. Such software may also be used to analyze historical or simulated data of a lithography process. Klarity™ ProDATA uses a substantial level of lithography knowledge in several areas including physically-based, curve-fitting functions for swing curves and contrast curves.

In other embodiments, the characteristics of a patterned wafer may additionally or alternatively be processed using image analysis software in combination with process window analysis software. One example of commercially available image analysis software is the SEM Image Analysis Module (SIAM) available from KLA-Tencor. The image analysis software may be used to analyze one pattern or to compare patterns from simulation. In general, the simulated pattern and/or data may be generated from a simulation program such as PROLITH, which is commercially available from KLA-Tencor. In general, PROLITH can simulate optical lithography and etch processes to provide images and three-dimensional representations of a wafer using a specific process parameter values. More specifically, PROLITH can predict lithographic metric measurements, such as critical dimension and overlay variations, for example.

As shown in step 26 of FIG. 2, the computer-implemented method may, in some embodiments, further include determining a correlation between process parameter values which affect both critical dimension and overlay variation. In some embodiments, the correlation may be determined using automated process control algorithms. Process control algorithms generally describe a relationship between one or more parameters of a process or a process tool and a property of a reticle, a wafer, or an integrated circuit. Such automated process control algorithms may be run using a software package such as Catalyst advanced process control (APC) commercially available from KLA-Tencor. Alternatively, the method may not include step 26 and the method may continue directly to step 28.

As stated above, the computer-implemented method described herein may generate a set of process parameter values which take into account the affects on both critical dimension as well as overlay variation. Consequently, FIG. 2 shows step 28 generating a set of process parameters for a lithography process based upon critical dimension and overly variation effect analyses of process parameter value variations. In particular, the method may avoid over adjusting a process parameter value which has a substantially similar effect on both critical dimension and overlay variation, thereby avoiding the potential creation of additional or different deviations. For example, in an embodiment in which critical dimension and overlay variation both increase with an increase in a process parameter value, the process parameter value may be adjusted to account for both critical dimension and overlay variation rather than adjusting the process parameter value for each wafer characteristic independently. In this manner, the process parameter value may not be overly increased. In addition, the method may balance process parameter values which have a counteracting effect on wafer feature characteristics. More specifically, in an embodiment in which critical dimension decreases while overlay variation increases with a given process parameter variation, the method may take into account the effect of the process parameter value variation to produce a wafer feature having characteristics within the design specifications of the device.

In general, "characteristics" of a wafer feature, as used herein, may refer to any attribute which may characterize the feature. For example, wafer feature characteristics may include any dimension of the feature, including but not limited to the critical dimensions of the feature. As noted above, "critical dimension," as used herein, may refer to a dimension of a wafer feature which is deemed to affect the functionality of a device formed therefrom. In addition, the characteristics of a wafer feature may include overlay variation of the feature relative to other features of the wafer. As noted above, "overlay variation" may refer to the amount a wafer feature is arranged away from its intended position on the wafer. Moreover, the characteristics of a wafer feature may include one or more metrics which describe the shape of a feature, such as corner rounding or line end shortening, for example.

In some cases, the computer-implemented method depicted in FIG. 2 may be adapted to generate a set of process parameter values which collectively minimize the number of critical dimension and overlay variation errors produced within a pattern fabricated from the lithography process. Critical dimension and overlay variation "errors," as used herein, may refer to measurements of such characteristics which are outside the design specifications of the device. As such, the computer-implemented method depicted in FIG. 2 may, in some embodiments, be adapted to select a set of process parameter values which form a wafer feature having characteristics within the design specifications of the device. In some cases, the set of process parameter values may be selected such that a wafer feature is formed having one or more characteristics substantially similar to the target specification values of the device. In general, specifications of a device are given as a range of values such that feature characteristic values of wafer features may vary slightly from device to device. In this manner, production throughput may not be severely sacrificed. Typically, however, there are target values within specification ranges which represent the optimum characteristics with which to form a functional device. Consequently, the term "target specification values", as used herein, may refer to the optimum values for the characteristics of the patterned wafer feature.

In any case, step 28 may be conducted through the use of algorithms. In some cases, the software used to compute the algorithms for step 28 may be substantially similar to the software used to compute the algorithms for step 24. For example, in some cases, the set of process parameter values may be generated using algorithms that are included within process window analysis software, simulation programs, and/or image analysis software as described above in reference to step 24. In addition or alternatively, other software may be used for step 28. For example, software that can be used to define model-parameters such as the Klarity™ ProDATA AutoTune™ module commercially available from KLA-Tencor may be used. Such software may use experimental or historical data to simulate performance characteristics of the resist. More specifically, the software provides data-fitting and analysis capabilities of lithography processes that are substantially physically correct.

As noted above, the computer-implemented method and carrier medium described herein may additionally or alternatively include producing a list of potential causes of specification deviations of wafer features fabricated from a lithography process. Such a computer-implemented method is described in reference to the flowchart illustrated in FIG. 3. In particular, FIG. 3 shows step 30 which includes tuning a lithographic tool simulation module with process parameter values used to fabricated wafers. In some cases, such a tuning process may be particularly targeted toward process parameter values which produce features having characteristics within specification. In some embodiments, the process parameter values may be from the same lithography process; and/or for the same wafer feature, for which a list of potential specification deviation causes is needed. In this manner, the lithographic tool simulation module may be tuned to examine a specific lithographic process and/or wafer feature. In other cases, the tuning process parameter values may be from a lithography process other than the one being evaluated for list of potential causes of a specification deviation. In addition or alternatively, the tuning process parameter values may be for the fabrication of a wafer feature other than the wafer feature for which a list of potential specification deviation causes is needed.

In any case, the lithographic tool simulation module may include, for example, simulation program such as PROLITH, which is commercially available from KLA-Tencor. In general, PROLITH can simulate optical lithography and etch processes to provide images and three-dimensional representations of a wafer using a specific process parameter values. More specifically, PROLITH can predict lithographic metric measurements, such as critical dimension and overlay variations, for example. Such a lithographic toll simulation module may be tuned with software, such as ProDATA AutoTune, commercially available from KLA-Tencor. Such software may use experimental or historical data to simulate performance characteristics of the resist. More specifically, the software provides data-fitting and analysis capabilities of lithography processes that are substantially physically correct. In yet other embodiments, step 30 may not be included in the method described herein. In particular, the lithographic tool simulation module may be programmed with process parameter values which are independent of the lithography process causing the error.

As shown in FIG. 3, the computer-implemented method may continue to step 32 in which one or more process parameter values within the lithographic simulation module is changed to simulate wafer feature characteristics that deviate from specification. In this manner, the method may attempt to try to recreate the process by which the specification deviation was caused. Such a step may be conducted by a simulation software program, such as PROLITH as described above in reference to step 30. As shown in step 34, the computer-implemented method may further include matching at least one of the simulated wafer feature characteristics with a deviant wafer feature characteristic previously fabricated by the lithography process. Such a deviant wafer feature characteristic may be taken, for example, from metrology data generated for a wafer produced by a failed for drifted lithography process. A "failed" lithography process, as used herein, may refer to a lithography process which produces a wafer with a particular number of feature characteristics outside the design specifications of the device. A "drifted" lithography process, on the other hand, may refer to a lithography process which exhibits a pattern of producing wafers with feature characteristics that are gradually approaching the limits of the design specifications of the device. In some cases, step 34 may be conducted by image analysis software such as SEM Image Analysis Module (SIAM) commercially available from KLA-Tencor. In general, the image analysis software may be used to compare patterns from simulation and experimental data.

Step 36 shows that the method may include identifying one or more common process parameter values used to generate the simulated wafer feature characteristics and the deviant wafer feature characteristic. Such an identification may lead to step 38 in which the one or more matched process parameter values are cited as potential causes of specification deviations within wafers fabricated from a lithography process. More specifically, step 38 may cite a potential cause of the deviant wafer feature characteristic. In some cases, a single process parameter may be attributed to the specification deviation. In other cases, however, specific combination of a plurality of process parameters may be attributed to the specification deviation. In either embodiment, steps 32–38 may be repeated as shown in step 40 such that a list of potential causes of specification deviations for wafer feature characteristics may be generated. In this manner, backward simulation may be used to generate a list of possible causes of lithography process failure or drift.

It will be appreciated to those skilled in the art-having the benefit of this disclosure that this invention is believed to provide computer-implemented methods and carrier mediums for optimizing lithographic processes. Further modifications and alternative embodiments of various aspects of the invention will be apparent to those skilled in the art in view of this description. For example, although the description provided herein is directed toward the fabrication of semiconductor devices, the computer-implemented method and carrier medium described herein may be used for any application in which lithographic processes are used. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method, comprising:
    analyzing a first set of process parameter value variations of a lithography process at least one affect critical dimensions of images produced from the lithography process;
    analyzing a second different set of process parameter value variations of the lithography process at least one affect overlay of the images;
    generating a first set of process parameter values for the lithography process based upon the step of analyzing the first set of process parameter value variations;
    generating a second different set of process parameter values for the lithography process based upon the step of analyzing the second set of process parameter value variations; and
    merging the first and second sets of process parameter values to produce a third set of process parameter values for the lithography process which collectively minimizes overlay and critical dimension specification deviations within images produced from the lithography process.

2. The method of claim 1, wherein the third set of process parameter values comprises an agglomeration of the first and second sets of process parameter values.

3. The method of claim 1, wherein the third set of process parameter values comprises different process parameter values than an agglomeration of the first and second sets of process parameter values.

4. The method of claim 3, wherein the step of merging comprises adjusting one or more of the process parameter values of the first and second sets of process parameter values.

5. A storage medium comprising program instructions executable on a computer system for:

analyzing a first set of process parameter value variations of a lithography process each of which primarily affect critical dimension of images produced from the lithography process;

analyzing a second different set of process parameter value variations of the lithography process each of which primarily affect overlay of the images;

generating a first set of process parameter values for the lithography process based upon the step of analyzing the first set process parameter value variations;

generating a second different set of process parameter values for the lithography process based upon the step of analyzing the second set of process parameter value variations; and merging the first and second sets of process parameter values to produce a third set of process parameter values for the lithography process which collectively minimizes overlay and critical dimension specification deviations within images produced from the lithography process.

6. The storage medium of claim 5, wherein the third set of process parameter values comprises an agglomeration of the first and second sets of process parameter values.

7. The storage medium of claim 5, wherein the third set of process parameter values comprises different process parameter values than an agglomeration of the first and second sets of process parameter values.

8. The storage medium of claim 7, wherein the program instructions for merging the first and second sets of process parameter values comprise program instructions for adjusting one or more of the process parameter values of the first and second sets of process parameter values.

* * * * *